US008526147B2

(12) United States Patent
Gallerano et al.

(10) Patent No.: US 8,526,147 B2
(45) Date of Patent: Sep. 3, 2013

(54) HIGH VOLTAGE TOLERANT SCR CLAMP WITH AVALANCHE DIODE TRIGGERING CIRCUIT

(75) Inventors: Antonio Gallerano, San Jose, CA (US); Vladislav Vashchenko, Palo Alto, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 407 days.

(21) Appl. No.: 13/065,744

(22) Filed: Mar. 28, 2011

(65) Prior Publication Data

US 2012/0250194 A1  Oct. 4, 2012

(51) Int. Cl.
*H02H 9/04* (2006.01)
(52) U.S. Cl.
USPC .......................................................... 361/56
(58) Field of Classification Search
USPC .......................................................... 361/56
See application file for complete search history.

(56) References Cited

U.S. PATENT DOCUMENTS 5,666,313 A * 9/1997 Ichiguchi ...................... 365/195
7,285,805 B1 * 10/2007 Vashchenko et al. ......... 257/173
2004/0195629 A1 * 10/2004 Lai et al. ....................... 257/355

OTHER PUBLICATIONS

Hopper et al., High Holding Voltage Cascoded LVTSCR Structures for 5.5-V Tolerant ESD Protection Clamps, IEEE Transactions on Device and Materials Reliability, vol. 04, No. 2, Jun. 2004, pp. 273-280.*

* cited by examiner

*Primary Examiner* — Jared Fureman
*Assistant Examiner* — Nicholas Ieva
(74) *Attorney, Agent, or Firm* — Eugene C. Conser; Wade J. Brady, III; Frederick J. Telecky, Jr.

(57) ABSTRACT

In an LVTSCR, an avalanche diode based control circuit controls both the base of the internal PNP of the LVTSCR as well as the gate of the LVTSCR.

10 Claims, 2 Drawing Sheets

HIGH VOLTAGE TOLERANT SCR CLAMP WITH AVALANCHE DIODE TRIGGERING CIRCUIT

FIELD OF THE INVENTION

The invention relates to ESD protection. In particular it relates to SCR based ESD protection.

BACKGROUND OF THE INVENTION

In any ESD protection design the normal operating voltage and triggering voltage of the ESD device are important considerations. Thick oxide modules are commonly rated at 2.5V, however it is not unusual to find circuit applications where there is need for 3.3V operating voltage. One approach to address the higher operating voltage is to include drain extensions. For example in the LVTSCR shown in FIG. 1 the drain extension is formed by providing a non self-aligned drain extension in the form of a deep implant n-well 100. The ESD protection device is implemented as a Silicon Controlled Rectifier (SCR) by adding a p+ diffusion 102 into the n-well 100 to act as a p-emitter for the SCR. The SCR is a snapback device, which has the advantage of being able to handle high ESD currents, however it requires a high triggering voltage in order to go into snapback mode. The presence of a MOSFET gate 104 lowers the triggering voltage somewhat to define the SCR as a low voltage triggered SCR (LVTSCR). The SCR device with its drain extension 100 has the advantage of meeting the 3.3 V operating voltage requirement but notwithstanding the lower triggering voltage of the LVTSCR, this triggering voltage nevertheless is still in excess of 10V. Since the triggering voltage is significantly above the normal operating voltage of 3.3V, the delay in responding to the onset of an ESD event makes the device vulnerable to permitting sneak current paths for the ESD current into the protected circuitry.

SUMMARY OF THE INVENTION

The present invention reduces the triggering voltage of the SCR device to about 5.7 V by providing a triggering circuit that makes use of a 5.7 V Zener diode as voltage reference.

According to the invention, there is provided a triggering circuit for an SCR ESD protection device that includes a gate and defines a PNP structure with a base region, and is operable to protect a protected circuit, comprising an avalanche diode with breakdown voltage above the normal operating voltage of the protected circuit, the triggering circuit defining a first reference voltage node operable to control the voltage on the base region of the PNP structure, and a second reference voltage node operable to control the voltage on the gate of the SCR ESD protection device. The protected circuit may be realized in any CMOS/BiCMOS technology in which a reference avalanche diode with appropriate breakdown voltage can be obtained. The avalanche diode is preferably implemented as a free device in the sense that its implementation does not require any additional process or masking steps in addition to those already present in the standard process flow of the CMOS/BiCMOS technology. The avalanche diode may be connected in series with a first resistor between a high voltage pad and ground and define the first reference voltage node between the avalanche diode and the resistor. The triggering circuit may further comprise a transistor that includes an anode, a cathode and a control electrode, wherein the first reference voltage node is connected to the control electrode. The transistor may be an NMOS transistor connected in series with a second resistor between the high voltage pad and ground. The second resistor may be connected to the drain of the NMOS transistor to define the second reference voltage node between the second resistor and the drain of the NMOS transistor. The transistor may be an NMOS transistor connected in series with a current path transistor that is connected to the high voltage pad. The current path transistor may comprise a first PMOS transistor connected with its drain to the drain of the NMOS transistor. The gate of the first PMOS transistor is preferably biased to keep the PMOS transistor on during normal operation. The gate of the first PMOS transistor may be connected to the first reference voltage node through a second PMOS transistor that is connected with its source to the gate of the first PMOS transistor and with its drain to a reference voltage e.g., a 1.2V reference. The reference voltage may be defined locally by a voltage divider circuit, e.g., by a chain of diode connected MOSFETs.

Further, according to the invention there is provided a method of reducing the triggering voltage of an LVTSCR that includes a gate and defines a PNP structure with a base, the method comprising increasing the voltage on the gate and decreasing the voltage on the base during an ESD event. Increasing the gate voltage may comprise connecting the gate to a high voltage pad via an avalanche diode to define a first reference node at the anode of the avalanche diode. Decreasing the voltage on the base of the PNP structure may comprise defining a second reference voltage relative to the high voltage pad. The second reference voltage may be defined by a resistor connected between the high voltage pad and the drain of an NMOS transistor, the gate of the NMOS transistor being controlled by the first reference voltage. The second reference voltage may be defined by a first PMOS transistor connected between the high voltage pad and the drain of an NMOS transistor, the gate of the PMOS transistor being connected to the first reference voltage via a second PMOS transistor.

Still further, according to the invention, there is provided an ESD protection circuit comprising an LVTSCR that includes a gate and defines a PNP structure with a base, the ESD protection circuit further comprising an avalanche diode with breakdown voltage above the normal operating voltage of the protected circuit to define a first reference voltage node, and a transistor having a control electrode connected to the first reference voltage node and defining a second voltage reference node relative to a pad or ground by being connected between the pad and ground. The avalanche diode may be connected as a high voltage reference by having its cathode connected to the pad and its anode connected to ground via a first resistor. The avalanche diode may instead be connected as a low voltage reference by having its anode connected to ground and its cathode connected to the pad via a first resistor. The protected circuit may be realized in any CMOS/BiCMOS technology in which a reference avalanche diode with appropriate breakdown voltage can be obtained. The avalanche diode is preferably implemented as a free device in the sense that its implementation does not require any additional process or masking steps in addition to those already present in the standard process flow of the CMOS/BiCMOS technology. Insofar as the avalanche diode is connected as a high voltage reference, the transistor may be an NMOS transistor connected in series with a second resistor between the high voltage pad and ground. The second resistor may be connected to the drain of the NMOS transistor to define the second reference voltage node between the second resistor and the drain of the NMOS transistor. The transistor may instead be an NMOS transistor connected in series with a current path transistor that is connected to the high voltage pad. The current path transistor may comprise a first PMOS transistor connected with its drain to the drain of the NMOS transistor. The gate of the first PMOS transistor is preferably biased to keep the PMOS transistor on during normal operation. The gate of the first PMOS transistor may be connected to the first reference voltage node through a second PMOS transistor that is connected with its source to the gate of the first PMOS transistor and with its collector to a reference voltage e.g., a 1.2V reference. Insofar as the avalanche diode is connected as a low voltage reference, the transistor may be a PMOS transistor connected in series with a second resistor between the high voltage pad and ground. The second resistor may be connected to the drain of the PMOS transistor to define the second reference voltage node between the second resistor and the drain of the PMOS transistor. The reference voltage may be defined locally by a voltage divider circuit, e.g., by a chain of diode connected MOSFETs.

DETAILED DESCRIPTION OF THE INVENTION

Figure 1:
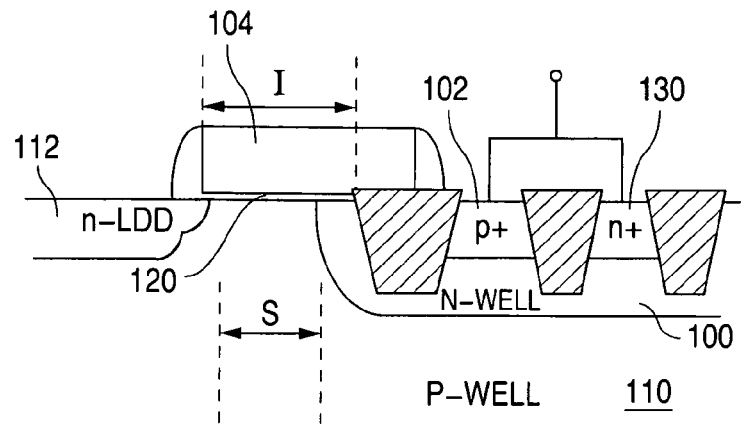
FIG. 1 shows a cross section through a prior art LVTSCR structure.
Figure 2:
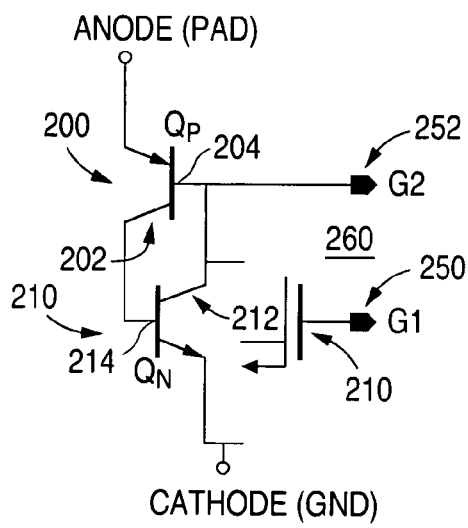
FIG. 2 shows a schematic representation of a prior art LVTSCR structure.

An equivalent circuit for an LVTSCR is shown in FIG. 2, which shows the PNPN structure depicted by a PNP transistor 200 connected with its collector 202 to the base 214 of an NPN transistor 210, and the base 204 of the PNP 200 connected to the collector 212 of the NPN 210. Referring to the sectional view of an LVTSCR in FIG. 1, the PNP transistor is defined by the p+ emitter region 102, the n-well 100 and the p-well 110. The NPN transistor is defined by the n-well 100, the p-well 110 and the cathode 112. It will be appreciated that access to the p-well 110 (which defines the base of the NPN transistor) is via the gate 104, which is separated from the p-well by an oxide layer 120. Access to the n-well (which defines the gate of the PNP transistor) is by way of the n+ anode 130. A typical LVTSCR such as the one shown in FIG. 1 can be triggered by supplying the appropriate voltage to the gate 104 (depicted in FIG. 2 by reference numeral 250) and the base 110 of the PNP (depicted by reference numeral 204 in FIG. 2).

During normal operation when there is no ESD event, node 250 is kept below the threshold voltage of the MOSFET 260 (which is defined by anode 130, gate 104 and cathode 112). Preferably the node 250 is kept at ground. Node 252 is biased to be close to the anode voltage to avoid leakage in the emitter diode defined by the PNP transistor 200.

In accordance with the invention, during an ESD event node 250 needs to be pulled up and node 252 needs to be pulled down so that the PNP transistor 200 and MOSFET 260 turn on to shunt ESD current to ground. In the absence of a triggering mechanism the n-well 100 to p-well 110 junction has to break down to achieve currently conduction. As discussed above, in a typical LVTSCR, the triggering voltage is approximately 10V.

Figure 3:
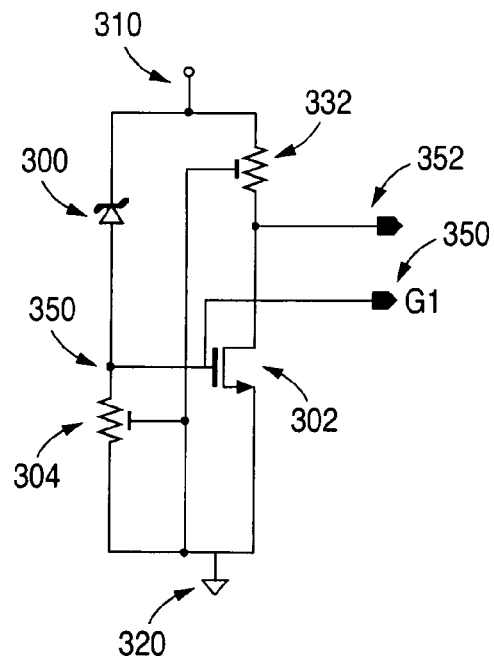
FIG. 3 shows a schematic circuit diagram of one embodiment of a triggering circuit of the invention.

However, the present invention provides for a triggering circuit that controls both nodes 250 and 252. One embodiment of such a triggering circuit is shown in FIG. 3, which makes use of an avalanche or Zener diode 300 to provide a voltage reference to the gate of an NMOS transistor 302. A resistor completes the current path from pad 310 through avalanche diode 300 to ground 320. An avalanche diode 300 with breakdown voltage of 5.7 V is chosen in this embodiment. Therefore any voltage at the pad below 5.7 V (e.g., during normal operation at 3.3V or early stages of an ESD pulse) does not cause current flow to ground and the voltage of the node 350 remains at ground. The NMOS 302 (which is a drain extension NMOS in this embodiment) therefore remains off and the node 352 is pulled up to the pad voltage since no current flows through pull-up resistor 332. Once the pad voltage exceeds the breakdown voltage of the avalanche diode 300 the voltage on node 350 rises, turning on the NMOS 302 and pulling node 352 down. The nodes 350, 352 of the control circuit are connected to the nodes 250, 252 of the LVTSCR, respectively to control the triggering of the LVTSCR at a voltage of about 5.7V. Since node 350 of the triggering circuit forms the control node for the node 250 of the LVTSCR (see FIG. 2), and node 352 forms the control node for the node 252 of the LVTSCR (see FIG. 2) the control circuit effectively controls both control nodes of the LVTSCR.

In the embodiment of FIG. 3 a pull up resistor 332 was used to pull up the node 352. In another embodiment, shown in FIG. 4, the pull up resistor is replaced by a PMOS transistor 400, which is properly biased to avoid exceeding the maximum gate-drain voltage $V_{DG}$ during normal operation. To bias the gate of the PMOS transistor 400, the gate is connected via PMOS transistor 402 to control node 450. The drain 452 of PMOS 402 is connected to a voltage reference, which in this embodiment is at 1.2 V. Thus, when the pad 410 is powered up, the node 460 is pulled to 1.2 V (since node 450 is at ground and PMOS 402 is turned on). Thus even for a pad voltage as high as 3.6V, $V_{DG}$ on PMOS 400 remains below 2.5, thereby avoiding exceeding the maximum gate-drain voltage on PMOS 400 during normal operation. It will be appreciated that the voltage reference need not be exactly 1.2 V, provided it is sufficient to avoid the maximum gate-drain voltage on the PMOS 400 being exceeded during normal operation.

During an ESD event, when the voltage on the pad 410 exceeds the breakdown voltage of the avalanche diode 470 (e.g. at 5.7V), the node 450 again goes high causing NMOS 480 to turn on and PMOS 402 to turn off, leaving PMOS 400 substantially floating, thereby permitting current flow through NMOS 480 and pulling node 452 low. Thus nodes 450, 452 can again be used to control the nodes of an LVTSCR such as nodes 250, 252, respectively.

Figure 4:
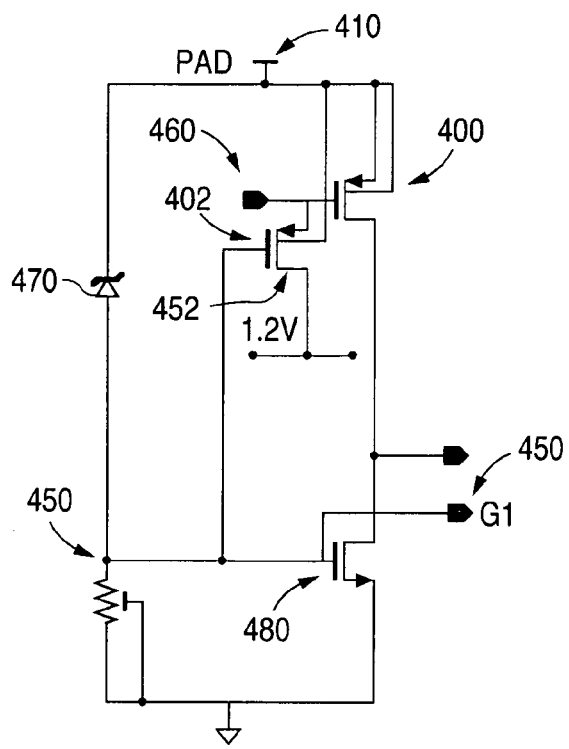
FIG. 4 shows a schematic circuit diagram of another embodiment of a triggering circuit of the invention.
Figure 5:
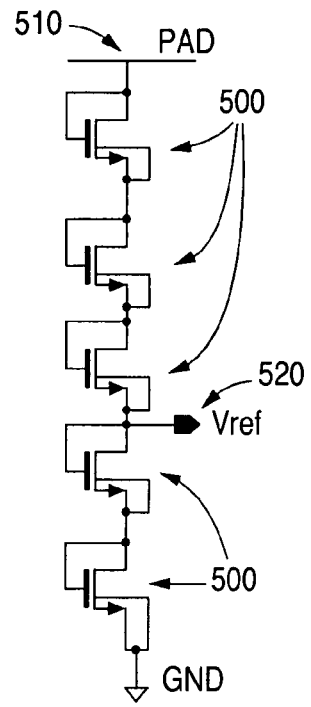
FIG. 5 shows a schematic circuit diagram of one embodiment of a voltage divider circuit for use in the invention.
Figure 6:
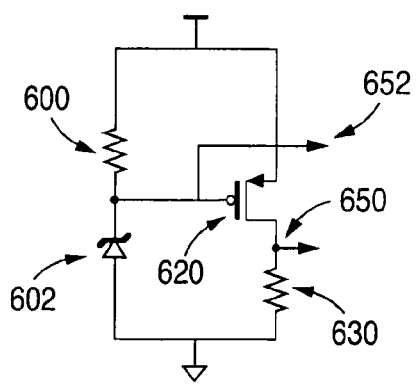
FIG. 6 shows a schematic circuit diagram of yet another embodiment of a triggering circuit of the invention.

The reference voltage for the PMOS 402 in FIG. 4 can be provided by a standard power supply level as is commonly available on-chip in a typical low voltage CMOS device, or can be generated locally, e.g., through a voltage divider connected to the pad. One such voltage divider embodiment is shown in FIG. 5, which comprises a chain of diode connected MOSFETs 500 connected to pad 510 to provide the requisite voltage (e.g., 1.2 V) at the node 520.

The present invention therefore provides a way of reducing the triggering voltage of an LVTSCR to a voltage just above the normal operating voltage, thereby reducing the likelihood of sneak paths for the ESD current into the protected circuit that would be protected by the LVTSCR.

The protected circuit may be realized in any CMOS/BiCMOS technology in which a reference avalanche diode with appropriate breakdown voltage can be obtained. The avalanche diode may be implemented as a free device in the sense that its implementation does not require any additional process or masking steps in addition to those already present in the standard process flow of the CMOS/BiCMOS technology.

While the present invention was described with respect to specific embodiments, it will be appreciated that the invention can be implemented in different ways without departing from the scope of the invention as defined by the claims. For example, the avalanche diode could be connected as a low voltage triggered device with a resistor 600 connected between the pad 610 and the cathode of the avalanche diode 602, the node between the resistor 600 and cathode of the avalanche diode 602 serving as control node 652 for the gate of a drain extension PMOS device 620 and defining the control node to the base of the PNP structure in the LVTSCR (not shown). The node to control the gate of the LVTSCR could be provided by a node 650 between the drain of the PMOS device 620 and a resistor 630 to ground.

The trigger circuit could in certain technologies also be implemented using bipolar devices with the proper voltage rating (for example NPN instead of NMOS devices 302, 480 and PNP instead of PMOS devices 400, 402). The PNPs in such an embodiment are preferably implemented as lateral PNPs in an n-well using p+ source/drain implants as collector and emitter regions which would provide the functionality of a pull-up bipolar device.

What is claimed is:

1. A triggering circuit for an SCR ESD protection device that includes a gate and defines a PNP structure with a base region, and is operable to protect a protected circuit, comprising
   an avalanche diode with breakdown voltage above the normal operating voltage of the protected circuit,
   a first reference voltage node operable to control the voltage on the base region of the PNP structure, and
   a second reference voltage node operable to control the voltage on the gate of the SCR ESD protection device,
   wherein the avalanche diode is connected in series with a first resistor between a high voltage pad and ground and the first reference voltage node is defined between the avalanche diode and the resistor,
   further comprising a transistor that includes an anode, a cathode and a control electrode, wherein the first reference voltage node is connected to the control electrode,
   wherein the transistor comprises an NMOS transistor connected in series with a current path transistor that is connected to the high voltage pad,
   wherein the current path transistor comprises a first PMOS transistor connected with its drain to the drain of the NMOS transistor,
   wherein the gate of the first PMOS transistor is biased to keep the first PMOS transistor on during normal operation,
   wherein the gate of the first PMOS transistor is connected to the first reference voltage node through a second PMOS transistor that is connected with its source to the gate of the first PMOS transistor and with its drain to a reference voltage.

2. A triggering circuit of claim 1, wherein the protected circuit is realized in CMOS or BiCMOS technology.

3. A triggering circuit of claim 2, wherein the avalanche diode is implemented as a free device in the sense that its implementation does not require any additional process or masking steps in addition to those already present in the standard process flow of the CMOS or BiCMOS technology.

4. A triggering circuit of claim 1, wherein the reference voltage is defined by a voltage divider circuit.

5. A triggering circuit of claim 4, wherein voltage divider comprises a chain of diode connected MOSFETs.

6. A method of reducing the triggering voltage of an L VTSCR that includes a gate and defines a PNP structure with a base, comprising
   increasing the voltage on the gate and decreasing the voltage on the base of the PNP structure during an ESD event,
   wherein increasing the voltage on the gate comprises connecting the gate to a first reference voltage node defined by the anode of an avalanche diode connected to a high voltage pad,
   wherein decreasing the voltage on the base of the PNP structure comprises defining a second reference voltage node defined by a first PMOS transistor connected between the high voltage pad and the drain of an NMOS transistor, the gate of the PMOS transistor being connected to the first reference voltage via a second PMOS transistor.

7. A method of claim 6, wherein decreasing the voltage on the base of the PNP structure comprises connecting the base of the PNP structure to a first reference voltage node defined by the cathode of an avalanche diode connected to a high voltage pad.

8. A method of claim 7, wherein increasing the voltage on the gate comprises connecting the first reference voltage node to the gate of a PMOS transistor and connecting the gate of the L VTSCR to a second reference voltage node defined by the drain of the PMOS transistor, which is connected to ground by a resistor.

9. An ESD protection circuit comprising
   an LVTSCR that includes a gate and defines a PNP structure with a base, an avalanche diode with breakdown voltage above the normal operating voltage of the protected circuit to define a first reference voltage node that is connected to one of the gate of the LVTSCR or the base of the PNP structure, and
   a transistor having a control electrode connected to the first reference voltage node and defining a second reference voltage node relative to a pad or ground, which is connected to the other of the gate of the LVTSCR or the base of the PNP structure,
   wherein the avalanche diode is connected as a high voltage reference by having its cathode connected to the pad and its anode connected to ground via a first resistor, and the transistor is an NMOS transistor connected with its drain to a first PMOS transistor, the gate of the first PMOS transistor being biased to keep the PMOS transistor on during normal operation,
   wherein the biasing is done by connecting the gate of the first PMOS transistor to the first reference voltage node through a second PMOS transistor that is connected with its source to the gate of the first PMOS transistor and with its drain to a reference voltage.

10. An ESD protection circuit of claim 9, wherein the reference voltage is defined by a voltage divider circuit.

* * * * *